United States Patent [19]
Hsieh et al.

[11] Patent Number: 5,874,764
[45] Date of Patent: *Feb. 23, 1999

[54] MODULAR MOSFETS FOR HIGH ASPECT RATIO APPLICATIONS

[75] Inventors: Chang-Ming Hsieh; Somnuk Ratanaphanyarat; Shao-Fu Sanford Chu; Louis Lu-chen Hsu, all of Dutchess County, N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 685,792

[22] Filed: Jul. 24, 1996

Related U.S. Application Data

[63] Continuation of Ser. No. 430,039, Apr. 27, 1995, abandoned.

[51] Int. Cl.$^6$ .................................................. H01L 27/118
[52] U.S. Cl. ........................ 257/401; 257/207; 257/211
[58] Field of Search ..................... 257/211, 287, 257/341, 342, 343, 365, 401

[56] References Cited

U.S. PATENT DOCUMENTS

| | | | |
|---|---|---|---|
| 3,749,985 | 7/1973 | Dawson ................................. | 327/581 |
| 4,038,677 | 7/1977 | Nagel et al. . | |
| 4,584,595 | 4/1986 | Kammiller ............................. | 257/365 |
| 4,651,181 | 3/1987 | David ..................................... | 257/342 |
| 4,742,425 | 5/1988 | Conzelmann et al. . | |
| 4,771,195 | 9/1988 | Stein ...................................... | 327/389 |
| 4,942,308 | 7/1990 | Conzelmann et al. . | |
| 5,021,861 | 6/1991 | Baliga . | |
| 5,029,322 | 7/1991 | Einzinger et al. ..................... | 257/341 |
| 5,097,302 | 3/1992 | Fujihara et al. ....................... | 257/341 |
| 5,194,765 | 3/1993 | Dunlop et al. ......................... | 326/87 |
| 5,243,229 | 9/1993 | Gabara et al. ......................... | 307/98 |
| 5,258,638 | 11/1993 | Elhatem et al. ....................... | 257/343 |
| 5,317,176 | 5/1994 | Schaper et al. ........................ | 247/287 |
| 5,446,310 | 8/1995 | Baliga et al. . | |

FOREIGN PATENT DOCUMENTS

| | | | |
|---|---|---|---|
| 1-16799 | 1/1989 | Japan . | |
| 4-105359 | 4/1992 | Japan ..................................... | 257/341 |
| 5-152524 | 6/1993 | Japan ..................................... | 257/365 |
| 94/09511 | 4/1994 | WIPO .................................... | 257/401 |

OTHER PUBLICATIONS

Stoisiek, et al., "2000–A/1–Ω Power MOSFET's in Wafer Repair Technique", IEEE Transactions on Electron Devices, vol. 37, No. 5, May 1990, pp. 1397–1401.

Stoisiek, et al., "A 400–A/2000–V MOS–GTO with Improved Cell Design", IEEE Transactions on Electron Devices, vol. 39, No. 6, Jun. 1992, pp. 1521–1528.

Venkatraman, et al., "Large Area MOS–Gate Power Devices Using Fusible Link Technology", IEEE, International Symposium on Power Semiconductor Devices, 1993. pp. 101–106.

*Primary Examiner*—David B. Hardy
*Attorney, Agent, or Firm*—Whitham, Curtis & Whitham; Jay H. Anderson

[57] ABSTRACT

An improved design for high aspect ratio MOS devices is capable of 100% yields. The design is suitable for low voltage CMOS devices, such as microprocessors, which use the high aspect ratio MOS devices in embedded applications, and for HEMTs in high frequency applications, such as high power microwave devices. The high yields reduce manufacturing costs. A modular MOS concept is introduced to realize the 100% yield of large channel width devices. The structure of the modular MOS device is a regular MOS device with a unit device channel width. This can be a multi-finger device which has a proper dimension to be able to fit in a given layout area. Therefore, the number of modules which are needed to form a full large width device is not only determined by module size, but also on the manufacturing yield record, allowed chip real estate and performance requirement.

6 Claims, 5 Drawing Sheets

5,874,764

MODULAR MOSFETS FOR HIGH ASPECT RATIO APPLICATIONS

This is a Continuation of application Ser. No. 08/430,039 filed Apr. 27, 1995, now abandonded.

BACKGROUND OF THE INVENTION

FIELD OF THE INVENTION

The present invention generally relates to the manufacture of metal oxide semiconductor field effect transistors (MOSFETs) having a high aspect ratio of width to length and, more particularly, to modular MOS transistor devices which enable the achievement of 100% yields.

BACKGROUND DESCRIPTION

Very large width MOS transistor devices are being used in many areas including, for example, high power microwave devices and embedded voltage regulators. An example of a voltage regulator used in a microprocessor has a NMOS device with a dimension of channel length 0.5 $\mu$m and channel width 32 mm. This large-width device is used as a controlled switch to provide all the power needed for the microprocessor. The microprocessor chip receives an unregulated 3.3V from an external power supply, and through two voltage regulators, the power is converted to 2.5V for the internal power supply.

The microprocessor has a high tendency to suffer a low yield problem due to such a high aspect ratio (i.e., width to length) device. A similar problem has been reported on microwave devices which also have high dimensional aspect ratios. For example, high electron mobility transistors (HEMTs) made of gallium arsenide have resulted in a yield of about 50–80%.

To solve this problem, one usually starts with a cleaner processing environment, better process control and/or improved lithographic technique. This can improve yield to a certain degree, but at greater expense of manufacture. However, 100% yield is difficult to reach, especially when channel length is continuously reduced to meet future performance challenges.

SUMMARY OF THE INVENTION

It is therefore an object of the present invention to provide an improved design for high aspect ratio MOS devices which is capable of 100% yields, thereby reducing the manufacturing costs of CMOS devices, such as microprocessors, using such high aspect ratio devices.

It is another object of the invention to provide a significant yield improvement in high aspect ratio MOS devices used for HEMTs in high frequency applications, such as high power microwave devices.

According to the invention, a modular MOS concept is introduced to realize a 100% yield of large channel width devices. The structure of the modular MOS device is a regular MOS device with a unit device channel width. This can be a multi-finger device which has a proper dimension to be able to fit in a given layout area. Therefore, the number of modules which are needed to form a full large width device is not only determined by module size, but also on the manufacturing yield record, allowed chip real estate and performance requirement.

The major objective of this invention is the design of a modular MOS structure which has the following properties:

- modules are electrically isolated from each other before inspection/testing;
- module(s) can be selectively disconnected from the main device using an available trimming technique;
- good modules can be connected together to form a main device with a predetermined width;
- each module is designed in such a way that it is easy for automatic or manual testing and trimming; and
- modules are also designed so that the trimming process will not affect the good modules.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
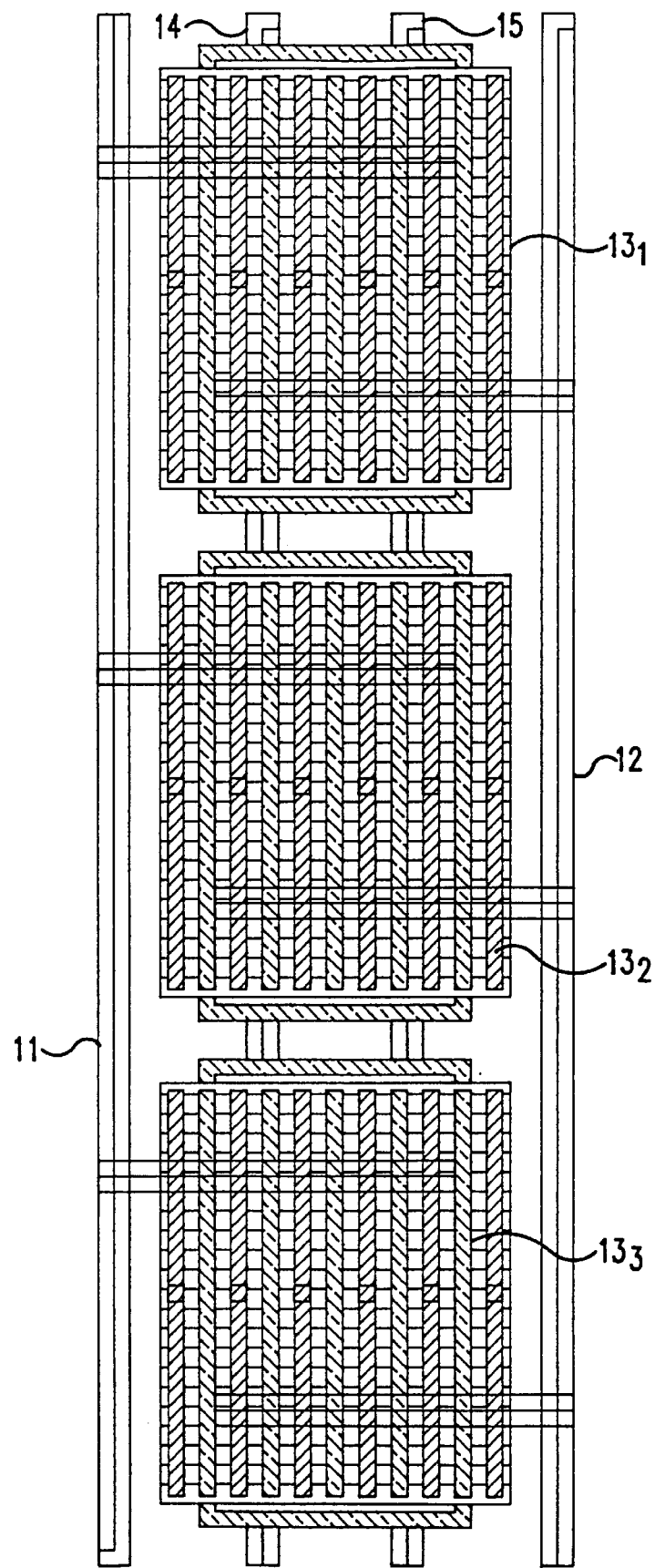
FIG. 1 is a plan view illustrating an example of a modular MOS device according to the invention comprising three modules.

Referring now to the drawings, and more particularly to FIG. 1, there is shown by way of example a plan view of a modular FET structure according to the invention. Three modules are shown, each sharing a common source line 11, a common drain line 12 and a common pair gate lines 14 and 15 extending beside and between the modules. The modules themselves are defined by the structures $13_1$, $13_2$ and $13_3$, shown in more detail in FIGS. 2 and 3.

Figure 2:
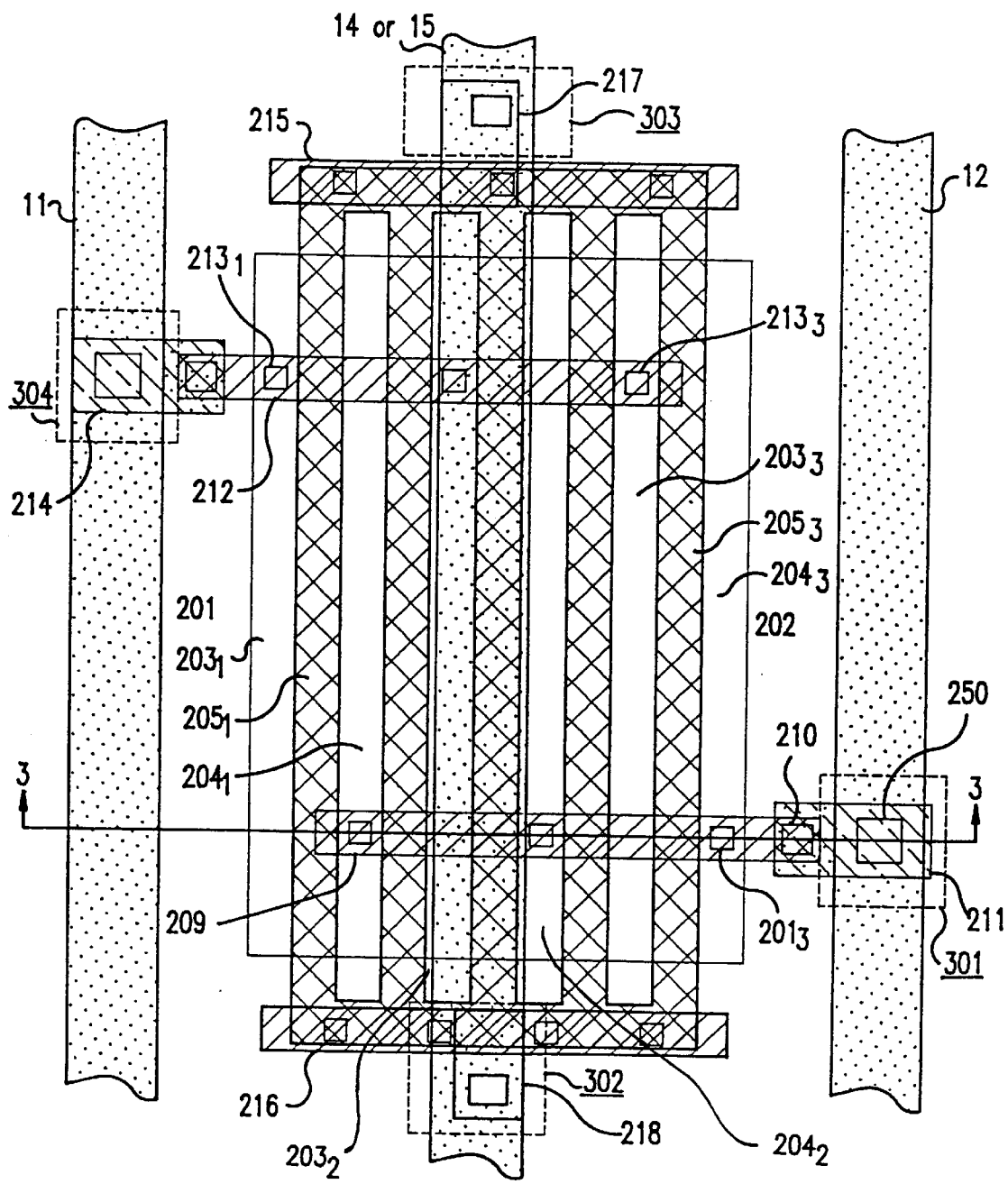
FIG. 2 is a plan view illustrating in more detail the middle module of the device shown in FIG. 1 to show the locations of a trimming operation to isolate a bad device.
Figure 3:
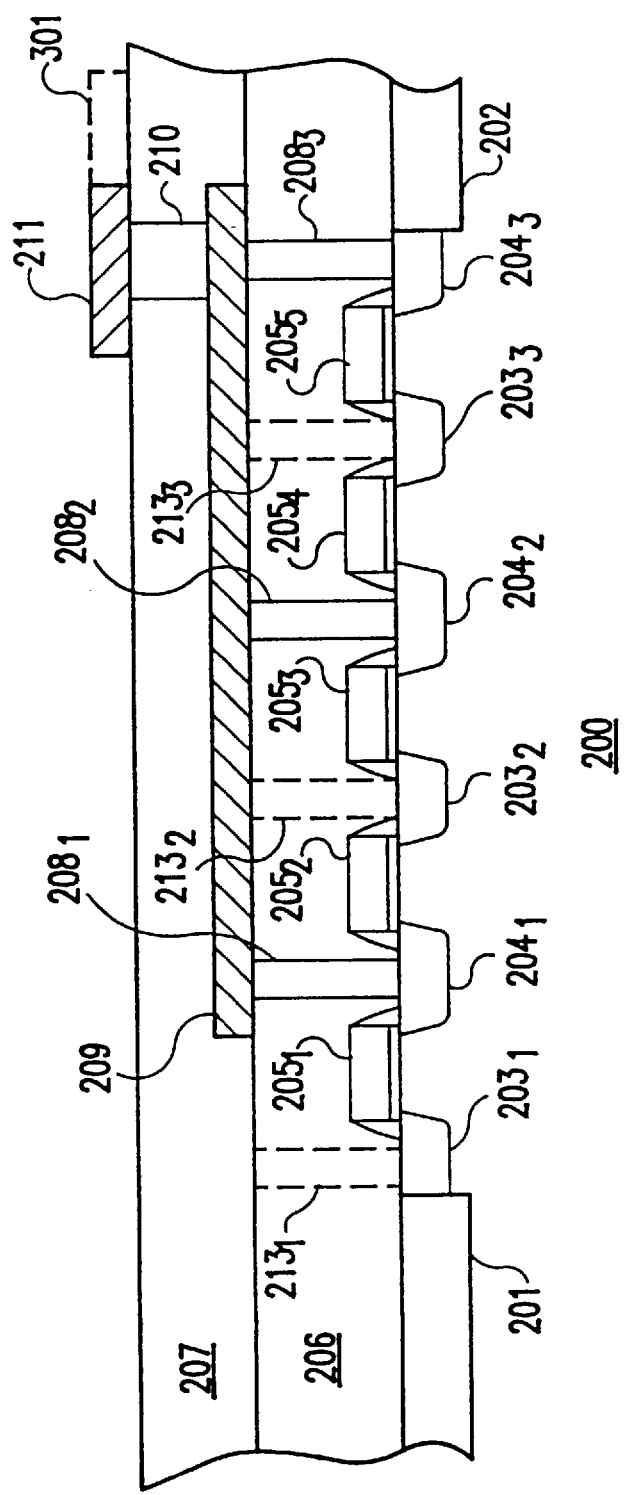
FIG. 3 is a cross-sectional view of the device in FIG. 2 showing the result of a trimming operation at one of the locations.

FIG. 2 shows an enlarged view of one of the module structures, and FIG. 3 is a cross-sectional view of the structure taken along section line 3 in FIG. 2. For simplicity here in FIG. 2, only one gate is shown. Between the isolation regions 201 and 202 in the substrate 200 (shown in FIG. 3), there are interdigitated fingers of sources $203_1$, $203_2$ and $203_3$ and drains $204_1$, $204_2$ and $204_3$. Overlying adjacent source and drain or drain and source fingers are gate structures $205_1$ to $205_5$. The drain fingers $204_1$, $204_2$ and $204_3$ are connected through insulating layer 206 by metal vias or studs $208_1$, $208_2$ and $208_3$ to a metal strap 209. Another metal via or stud 210 connects the metal strap 209 through insulating layer 207 to a short metal strap 211 that is connected to the drain line 12. A similar connection is made between the source fingers $203_1$, $203_2$ and $203_3$ to a metal strap 212 (shown in FIG. 2 only) by metal vias or studs $213_1$, $213_2$ and $213_3$. The metal strap 212 connected to the source studs $213_1$, $213_2$ and $213_3$ is connected by a metal via or stud (not shown) to another short metal strap 214 (shown only in FIG. 2), which is connected to the source line 11. The gate structures $205_1$ to $205_5$ are similarly connected via metal vias or studs (not shown) to metal straps 215 and 216 (shown only in FIG. 2) at the interface of insulating layers 206 and 207. The metal strap 215 is, in turn, connected by a metal via or stud (not shown) and a short metal strap 217 (shown only in FIG. 2) to gate line 14, while the metal strap 216 is connected by a metal via or stud (not shown) and a short metal strap 218 (shown only in FIG. 2) to gate line 15. In FIG. 2, the dotted boxes 301, 302, 303, and 304 show the trim areas for the drain, gate and source, respectively.

Figure 4:
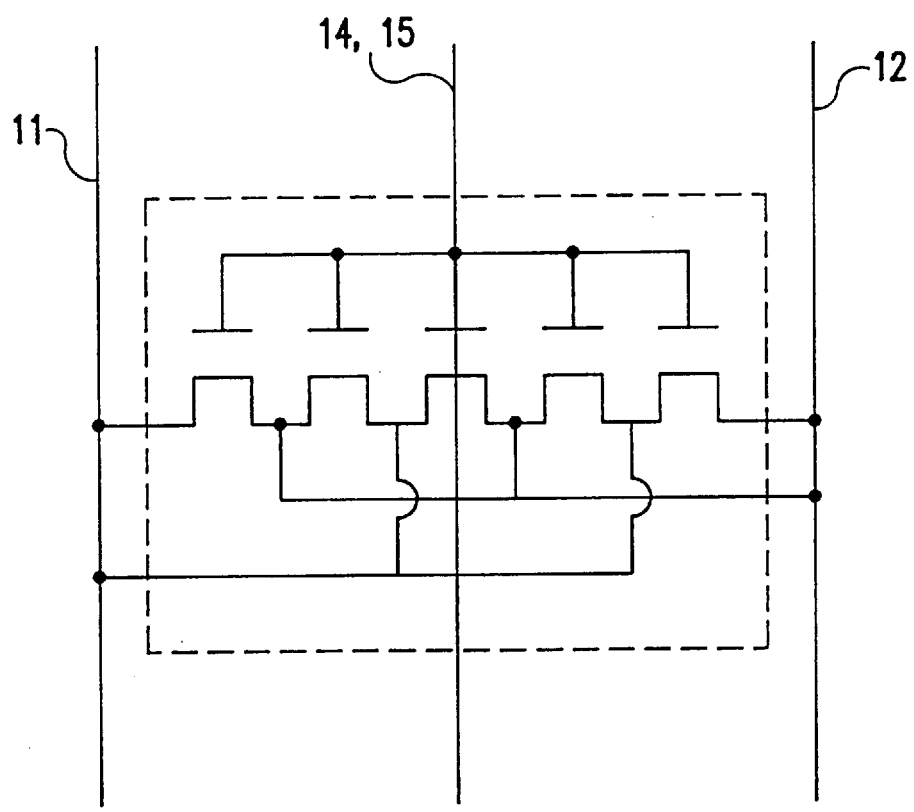
FIG. 4 is schematic diagram of the circuit for the module shown in FIGS. 2 and 3.

FIG. 4 shows a schematic diagram of the equivalent circuitry of the module shown in FIGS. 2 and 3, the circuitry being identical for all other modules. A module may be viewed as being composed of a plurality of FET devices connected in parallel. In the example illustrated, there are five such FET devices. Thus, the structures shown in FIGS. 2 and 3, each composed of a plurality of interdigitated fingers defining multiple source and drain structures with overlapping gate structures, define five FET devices connected in parallel in this example.

Up to the first metallization layer 209 at the interface of the insulating layers 206 and 207, each module is electrically isolated from the others. This makes it possible, if any bad device is detected in a module, for the whole module to be discarded. Therefore, based on the yield data, one can estimate how many modules are needed during layout design. Pico probes can be built in the module for testing. Testing can also be done by electron beam probing together with visual inspection. In this way, a bad device having, for example, a gate open or short, contamination, gate oxide failure, etc., can be singled out.

Figure 3A:
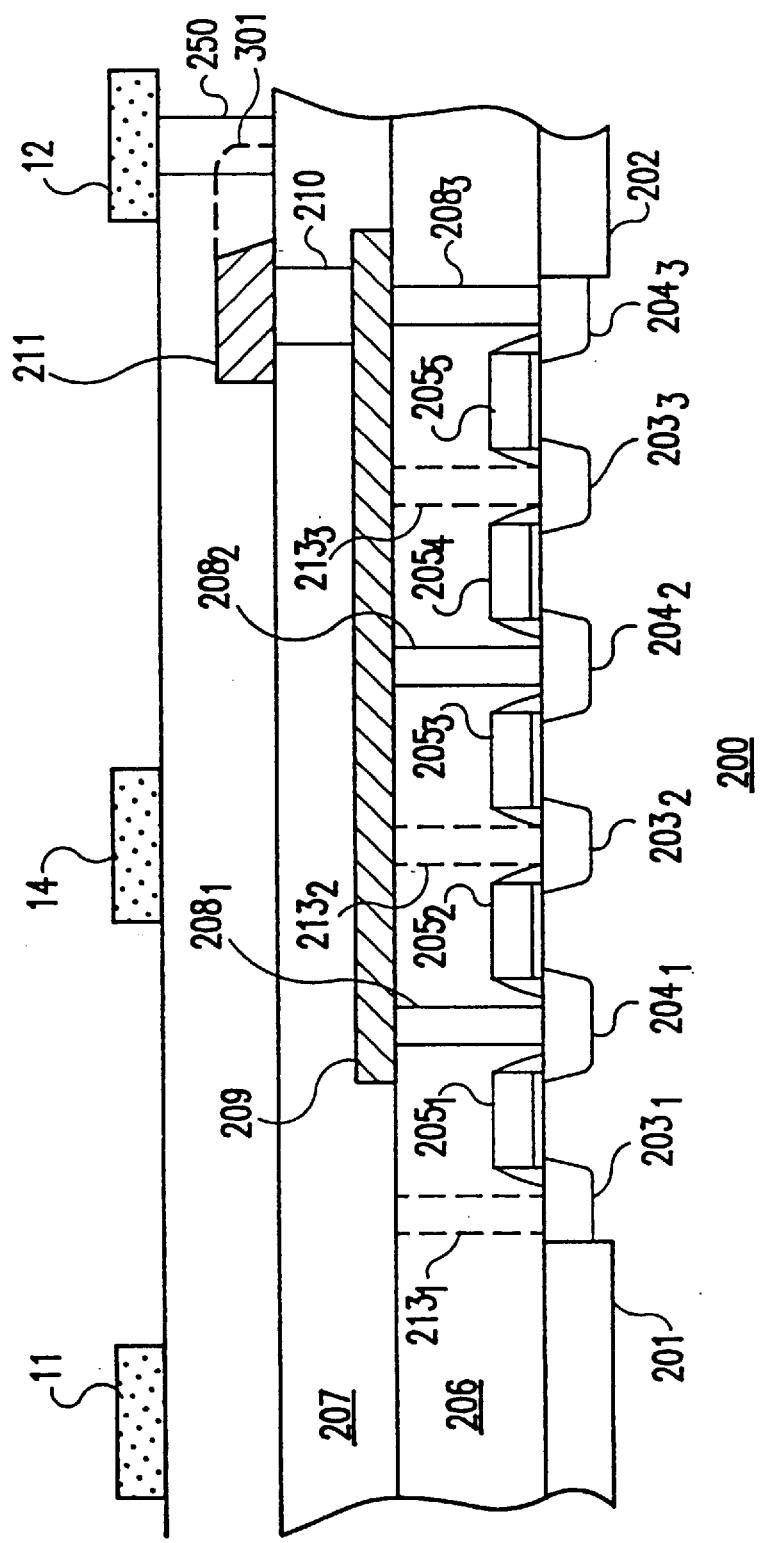
FIG. 3A is a cross-sectional view similar to that of FIG. 3 showing the effect of trimming.

If one of the devices defined by a source finger, an adjacent drain finger and an overlapping gate structure is defective, the entire module is removed by trimming at the trim spots shown in FIG. 2. These trim spots are the exposed metal straps 211, 214, 217, and 218, which are exposed on the top surface of the insulating layer 207. One such trim spot for the metal strap 211 is shown in FIG. 3A at 301 where the metal strap 211 is trimmed to disconnect it from the drain line 12. Similarly, the metal straps 214, 217 and 218 are trimmed to disconnect them from the source line 11 and the gate lines 14 and 15, respectively. It is also possible to modify the geometry of the embodiment of the structure shown in FIG. 2 so that all the trimming spots (i.e., all the interconnecting straps) are exposed at a single location on the second wiring level. In this way, a single trimming area is defined requiring only one trimming operation to completely isolate the module from the other modules in the structure. It is also possible to locate the trim spot in the first metal layer, so that the second metal layer can be eliminated.

Unwanted modules, either bad or extra ones, can be disconnected using known trimming techniques using a fine resolution, high energy beam such as, for example, a laser beam, a focused ion beam or any contamination-free particle beam. Since no metal interconnection between modules exists during trimming, there will be no thermal damage on the adjacent modules. The beam spot is so confined within the bad module that there will be no physical damage to the adjacent modules. Also, since all the trimming mechanisms are chemical and mechanical, there will be no residual material left in the trimmed area. In other words, the modular MOS device is designed in such a way that good devices are not affected by the trimming process. After removal of bad or unwanted modules, the next metal level connects only the good, remaining modules.

The several modules of the device may be all one size, corresponding to a unit size for the module. Thus, width control may be achieved to within approximately one half the unit size on a worst case basis. Alternatively, the modules may be of differing sizes. By selecting among the differing sizes, a more precise control of the width of the final device may be achieved.

The trimming techniques, either by laser beam or focused ion beam, are mature technologies in the semiconductor industry. They have been used in the areas such as trimming lithographic masks, programmable fuses, resistors, conductors, and so forth. However, this is the first use of trimming techniques to ensure full yield on large width MOS devices. This method is applicable for circuits with devices with large device width dimension and a slight variation on width does not affect the performance. That is, a ±10% variation in width is acceptable. On the other hand, for devices that require critical width dimension control, a module design that combines with differing width dimensions can be fabricated. In this way, large-width dimension modules are used to determine the coarse width size, while the small-width dimension modules are used to fine tune the final width dimension.

A 100% yield with good channel width control can be achieved in this way. Without the modularity according to the present invention, one can not obtain 100% yield on the large channel width devices. The invention is especially suitable for a voltage regulator for low power CMOS applications because the 100% yield is the key to reducing microprocessor manufacturing costs.

While the invention has been described in terms of a single preferred embodiment with suggested modifications, those skilled in the art will recognize that the invention can be practiced with modification within the spirit and scope of the appended claims.

Having thus described our invention, what we claim as new and desire to secure by Letters Patent is as follows:

1. A modular MOS device to implement high aspect ratio of channel width to channel length FET devices, wherein the channel width is many times larger than the channel length, said modular MOS device comprising:

a plurality of modules on a common substrate, each of said plurality of modules comprising:

a plurality of FETs, each of said FETs including a plurality of interdigitated finger gate structures of predetermined sizes between alternating source and drain structures, a FET source line commonly connecting the source structures to a first strap on a first level of metalization, a FET drain line commonly connecting the drain structures to a second strap on said first level of metalization, and a FET gate line commonly connecting each of said interdigitated finger gate structures to a third strap on said first level of metalization, each module being electrically isolated from other modules at said first level of metalization and a number of modules being determined by yield data and a designed channel width;

a common source line, a common drain line and a common gate line on a third level of metalization and extending between said plurality of modules; and interconnect means comprising trim straps on a second level of metalization connecting said first, second and third strap of each module to said common source line, said common drain line, and said common gate line, respectively, said trim straps including selectively openable trim spots, any bad or unwanted devices in the modular structure being isolated by selectively opening said trim spots to provide a 100% yield of the FET devices and to define a channel width of the trimmed modular MOS device.

2. The modular MOS device recited in claim 1 wherein each of said modules are identical in size corresponding to a unit size of the modular MOS device.

3. The modular MOS device recited in claim 1 wherein said modules have differing sizes allowing a high aspect ratio of channel width to channel length FET device to be fabricated with precise channel width control.

4. The modular MOS device recited in claim 1 wherein said trim spots are selectively openable using a fine resolution energy beam.

5. The modular MOS device recited in claim 4 wherein the high energy beam is a laser beam or a contamination-free particle beam.

6. The modular MOS devise recited in claim 1 wherein trim straps are located adjacent each said FET, said adjacent trim straps connecting said adjacent FET source and drain line to said common source and drain lines, respectively.

* * * * *